US007887334B2

(12) United States Patent
Miki et al.

(10) Patent No.: US 7,887,334 B2
(45) Date of Patent: Feb. 15, 2011

(54) BOARD CONNECTING CONNECTOR WITH BOARD HOLDING DEVICE

(75) Inventors: Yasuyuki Miki, Shinagawa (JP); Mitsuru Kobayashi, Shinagawa (JP); Hideo Miyazawa, Shinagawa (JP); Hiroshi Tajiri, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 0 days.

(21) Appl. No.: 12/727,360

(22) Filed: Mar. 19, 2010

(65) Prior Publication Data

US 2010/0248502 A1 Sep. 30, 2010

(30) Foreign Application Priority Data

Mar. 24, 2009 (JP) ............................ 2009-072697

(51) Int. Cl.
*H01R 12/00* (2006.01)
*H05K 1/00* (2006.01)

(52) U.S. Cl. ........................................ 439/62; 439/157

(58) Field of Classification Search ................... 439/62, 439/157, 160, 325, 326, 327, 328
See application file for complete search history.

(56) References Cited

U.S. PATENT DOCUMENTS 4,995,825 A * 2/1991 Korsunsky et al. .......... 439/328
5,100,337 A * 3/1992 Lee Chao .................. 439/326
5,154,627 A * 10/1992 Lee ........................... 439/326
5,242,312 A * 9/1993 Tondreault .................. 439/328
5,286,217 A * 2/1994 Liu et al. .................... 439/326
5,340,328 A * 8/1994 Lee ........................... 439/326
5,413,497 A * 5/1995 Lwee ......................... 439/328
5,577,922 A 11/1996 Enomoto et al.
5,997,331 A * 12/1999 Tu ............................ 439/328
7,578,689 B2 * 8/2009 Guan et al. ................. 439/327
7,677,907 B2 * 3/2010 Guan et al. ................. 439/157

FOREIGN PATENT DOCUMENTS

JP 7-296888 A 11/1995
JP 10-177080 A 6/1998

* cited by examiner

*Primary Examiner*—Hae Moon Hyeon
(74) *Attorney, Agent, or Firm*—IPUSA, PLLC

(57) ABSTRACT

A board connecting connector configured to mount a mounting board on a motherboard, the board connecting connector includes a connector main body having one end fixed to the motherboard and another end including an inserting opening where the mounting board is inserted; a plurality of connector pins provided inside the inserting opening, the connector pins coming in contact with a plurality of terminals provided at an inserting side of the mounting board; and a board holding member elastically deformably standing at a side surface of the connector main body, wherein the board holding member is inserted in a position where the terminals of the mounting board come in contact with the connector pins and is engaged with an edge part of the mounting board, so that the mounting board is held in an inserting completion position.

6 Claims, 14 Drawing Sheets

BOARD CONNECTING CONNECTOR WITH BOARD HOLDING DEVICE

CROSS-REFERENCE TO RELATED APPLICATIONS

This patent application is based upon and claims the benefit of priority of Japanese Patent Application No. 2009-072697 filed on Mar. 24, 2009 the entire contents of which are incorporated herein by reference.

BACKGROUND OF THE INVENTION

1. Field of the Invention

The present invention generally relates to connectors for connecting boards. More specifically, the present invention relates to a connecting board connector, the connector being where the board is inserted.

2. Description of the Related Art

In an electronic apparatus such as a personal computer or a server, as a structure where a circuit having an electronic component such as a memory or an IC chip is often established, a structure described in, for example, Japanese Laid-Open Patent Application Publication No. 10-177080 has been suggested. In this structure, a board is inserted into a connecting board connector mounted on a motherboard to make electrical connection.

In addition, for example, Japanese Laid-Open Patent Application Publication No. 7-296888 suggests a connecting board connector having an engaging member and an eject mechanism. The engaging member is configured to engage a notch of an inserted board. The eject mechanism is configured to deform the engaging member in an engaging cancelling direction and to move the board in inserting and detaching directions.

However, in the connecting board connector discussed in Japanese Laid-Open Patent Application Publication No. 10-177080, by inserting an end part of the board, plural connector pins provided in the connector come in contact with terminals of the board. Furthermore, the board is sandwiched by contact pressures of the plural contact pins. Accordingly, for example, if vibration occurs while the connector is being carried, an inserting completion position of the board may be shifted.

In addition, in the connecting board connector, for the connector having the eject mechanism, as discussed in Japanese Laid-Open Patent Application Publication No. 7-296888, the engaging member is separated from the notch of the board by a pressing operations force applied to both ends in a longitudinal direction. In addition, the eject mechanism is provided at both ends in the longitudinal direction, the eject mechanism being where plural components such as a pressing lever configured to press the board in inserting and detaching directions, a cam, a connecting pin, and others are connected. Hence, space required for providing the connector may be large so that it may be difficult to miniaturize a motherboard or a housing and to achieve space savings.

SUMMARY OF THE INVENTION

Accordingly, embodiments of the present invention may provide a novel and useful connecting board connector solving one or more of the problems discussed above.

More specifically, the embodiments of the present invention may provide a connecting board connector whereby position shift of the board can be prevented and it is possible to achieve miniaturization and space savings.

Another aspect of the embodiments of the present invention may be to provide a board connecting connector configured to mount a mounting board on a motherboard, the board connecting connector including:

a connector main body having one end fixed to the motherboard and another end including an inserting opening where the mounting board is inserted;

a plurality of connector pins provided inside the inserting opening, the connector pins coming in contact with a plurality of terminals provided at an inserting side of the mounting board; and a board holding member elastically deformably standing at a side surface of the connector main body, wherein the board holding member is inserted in a position where the terminals of the mounting board come in contact with the connector pins and is engaged with an edge part of the mounting board, so that the mounting board is held in an inserting completion position.

According to the embodiments of the present invention, a board holding member configured to elastically deformably stand is provided at a side surface of a connector main body. Hence, it is possible to hold another board (mounting board) in an inserting completion position and to achieve miniaturization of the connector main body and space savings.

Additional objects and advantages of the embodiments are set forth in part in the description which follows, and in part will become obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 1 through FIG. 10 of embodiments of the present invention.

Embodiment 1

Figure 1:
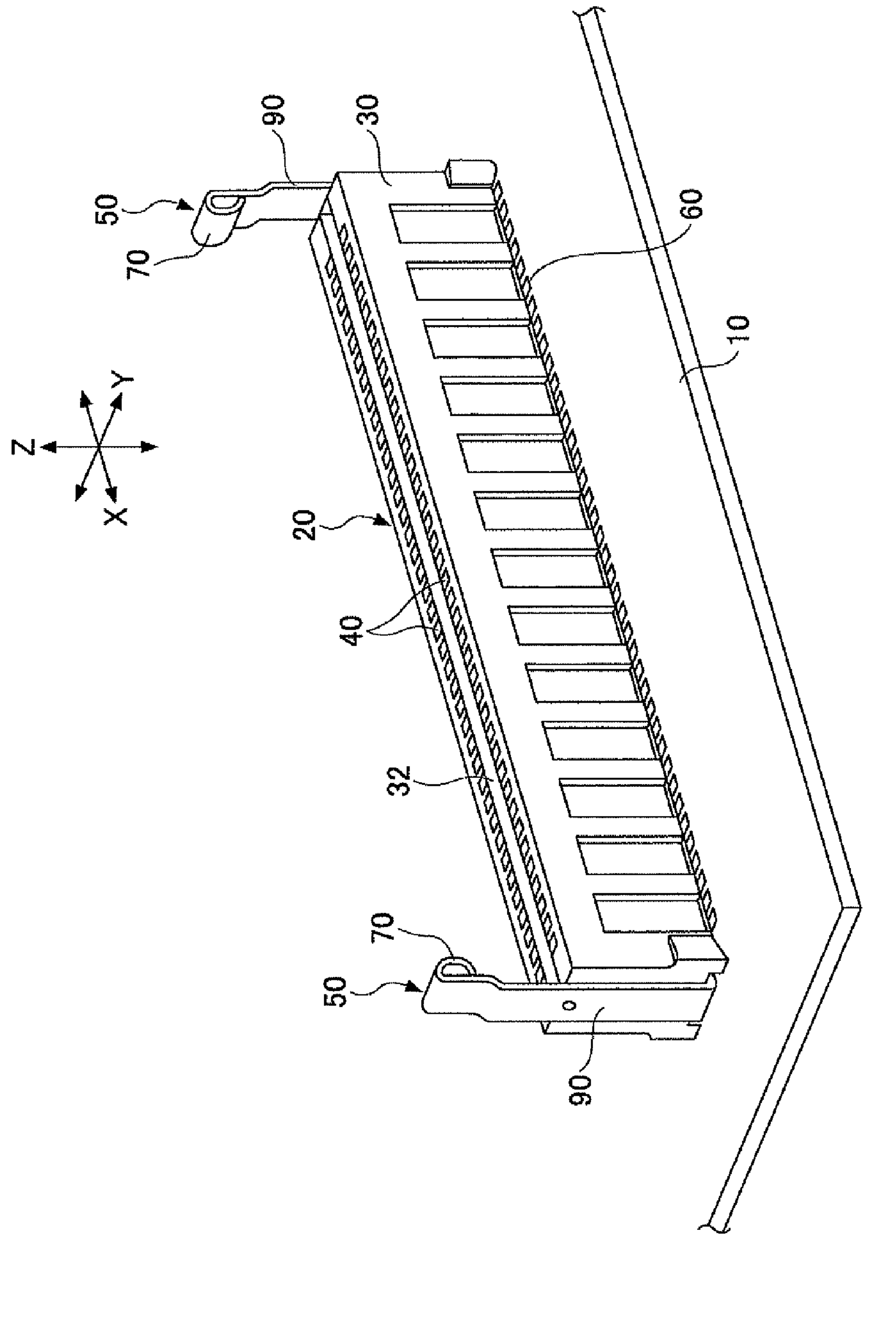
FIG. 1 is a perspective view showing an example of a connecting board connector of an embodiment of the present invention.

FIG. 1 is a perspective view showing an example of a connecting board connector of an embodiment of the present invention. As shown in FIG. 1, a connector 20 for connecting a board is mounted on an upper surface of a motherboard 10. The motherboard 10 is, for example, installed in an electronic apparatus such as a personal computer, a server, or the like. The connector 20 is, for example, a card edge connector. The connector 20 is an expansion connector where an expansion board (another board, mounting board) with an electronic component such as an IC chip or IC memory mounted is inserted.

(Structure of Connector 20)

The connector 20 includes a connector main body 30, plural connector pins 40, and a pair of board holding members 50.

The connector main body 30 is made by molding with a resin material having insulation. A lower surface (one end) of the connector main body 30 is fixed to the motherboard 10. An inserting opening 32 is provided at an upper surface (another end) of the connector main body 30. An expansion board (another board, mounting board) is to be inserted in the inserting opening 32. A long and narrow space extending in a longitudinal direction (X direction) is formed inside the inserting opening 32.

In addition, the inserting opening 32 has dimensions slightly greater than the thickness (dimension in a Y direction) and the width (dimension in an X direction) of the expansion board so that the expansion board (another board, mounting board) discussed below can be inserted.

The plural connector pins 40 are provided in an inside space of the inserting opening 32 so that the connector pins 40 come in contact with corresponding terminals of the expansion board to be inserted. The connector pins 40 are arranged in parallel with each other with a designated spacing so that the connector pins 40 correspond to the terminals.

In addition, for example, two lines of 35 connector pins 40 (70 connector pins 40 in total) are provided one at each side in the Y direction of the inserting opening 32. Furthermore, lower ends of the connector pins 40 are soldered to corresponding electrode pads 60 formed on an upper surface of the motherboard 10. Thus, the connector pins 40 are electrically connected to an electric circuit provided at the motherboard 10 and are fixed to the motherboard 10.

The board holding member 50 is formed of, for example, a metal spring member such as stainless. The board holding members 50 are furnished standing one along each side surface of the connector main body 30 in a longitudinal direction (X direction).

In addition, the board holding members 50 are, during a process where the expansion board is inserted in the inserting opening 32, elastically deformed in the longitudinal direction (X direction) and engaged with corresponding edge parts of left and right side surfaces of the expansion board so that the expansion board is held in the inserting completion position.

(Structure of Board Holding Member 50)

Here, a structure of the board holding member 50 is discussed.

Figure 2:
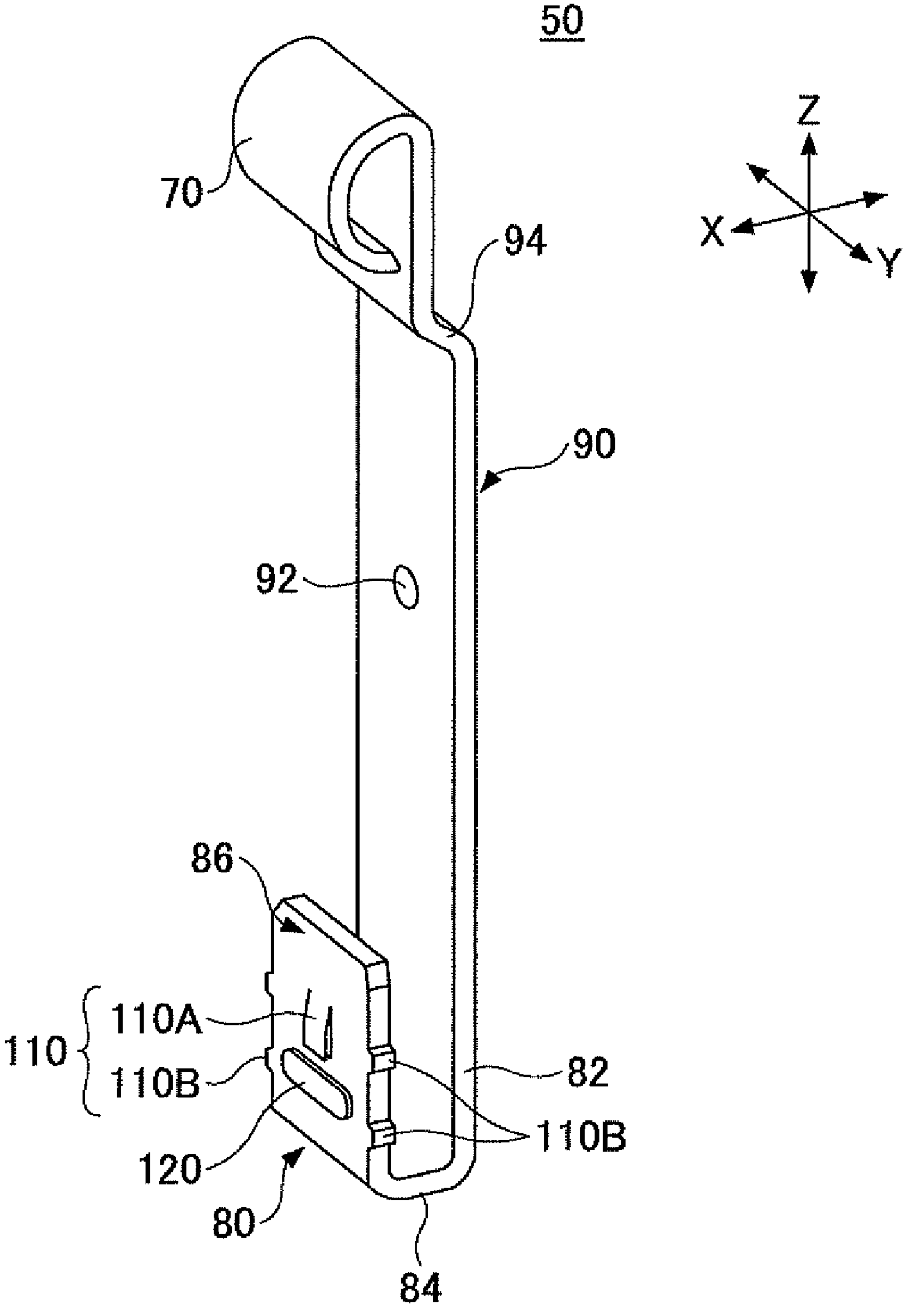
FIG. 2 is a perspective and expanded view showing a board holding member.
Figure 3A:
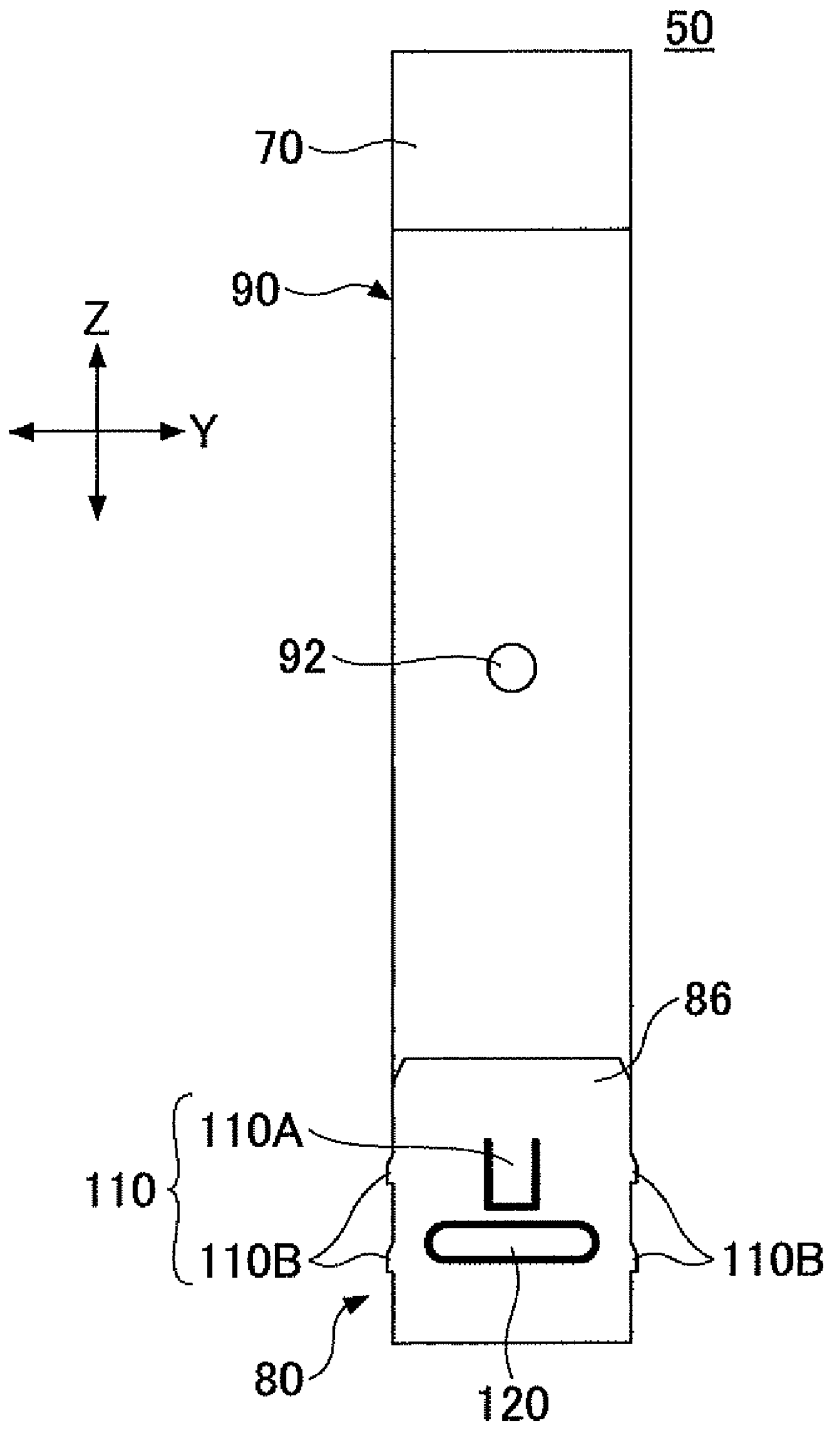
FIG. 3A is a front view of the board holding member.
Figure 3B:
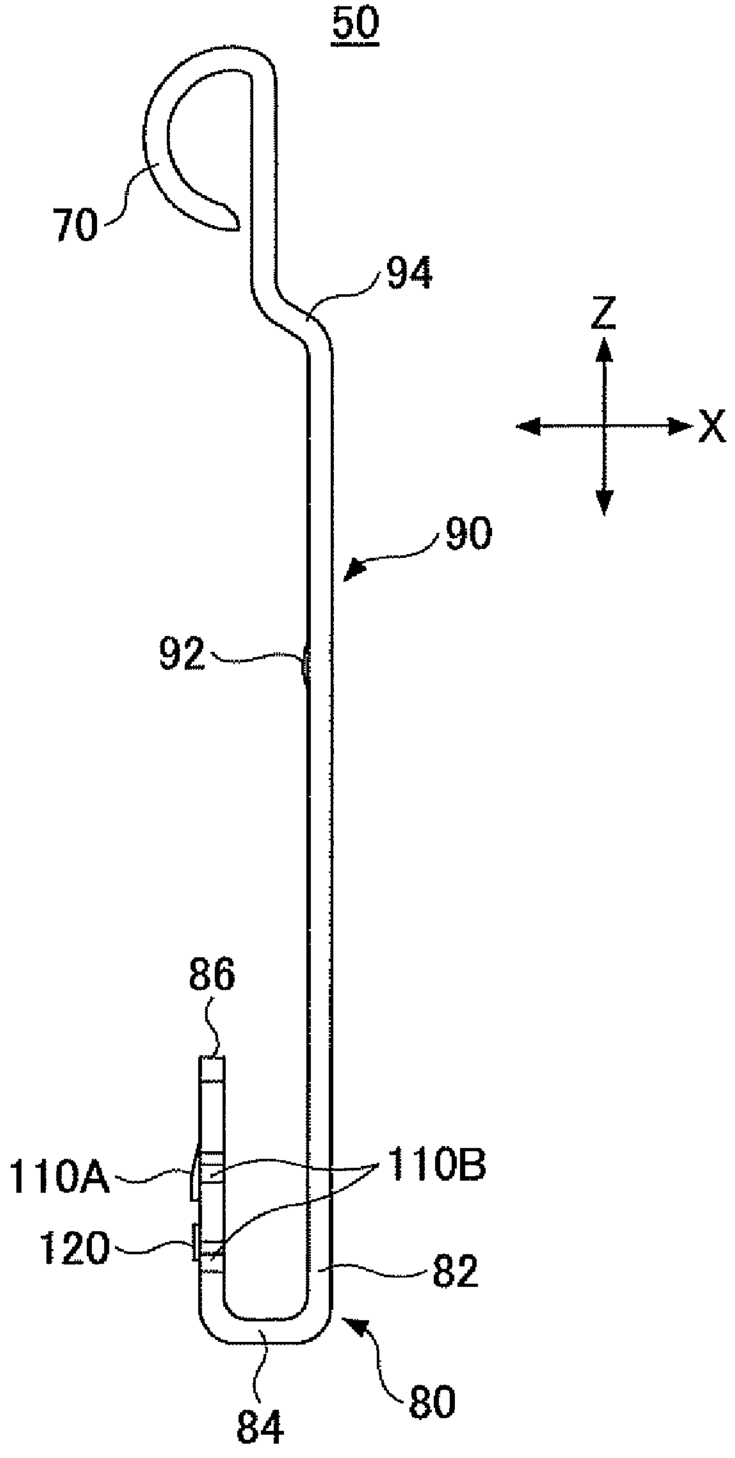
FIG. 3B is a side view of the board holding member.

FIG. 2 is a perspective and expanded view showing the board holding member 50. FIG. 3A is a front view of the board holding member 50. FIG. 3B is a side view of the board holding member 50.

As shown in FIG. 2, FIG. 3A and FIG. 3B, the board holding member 50 includes an engaging portion 70, a fixing part 80 and an elastic arm part 90. The engaging portion 70 is formed so as to have an arc-shaped configuration (a half-circle shaped configuration) which is curved toward an inside at an upper end (one end) of the board holding member 50, so that slide resistance is reduced when an inserting operation or inserting and detaching operation of an expansion board 100 (see FIG. 5B and FIG. 6B) is performed.

In addition, the engaging portion 70 is engaged with a concave part 102 (see FIG. 5B and FIG. 6B) formed at an edge part of the expansion board 100 inserted in the inserting opening 32 so as to hold the expansion board 100.

The fixing part 80 is bent so as to have a U-shape and be fixed to a bottom part side of the connector main body 30. In other words, the fixing part 80 includes a vertical part 82, a horizontal part 84, and a press fitting part 86. The vertical part 82 continues to the elastic arm part 90. The press fitting part 86 is bent upward more than the inside edge part of the horizontal part 84.

The press fitting part 86 has dimensions and a configuration whereby the press fitting part 86 can be press fit in a slit-shaped furnishing hole (see FIG. 4A and FIG. 4B) which opens at a lower surface side of the connector main body 30. In addition, the press fit part 86 includes a locking part (retaining part) 110 and a convex part 120.

The locking part 110 is locked (restrained) with an internal wall of the furnishing hole 34. The convex part 120 comes in contact with the internal wall of the furnishing hole 34.

The locking part 110 includes a first locking part (retaining part) 110A and second locking parts (retaining parts, engaging parts) 110B. The first locking part 110A is engaged with a wide side internal wall of the furnishing hole 34. The second locking parts 110E are engaged with narrow side internal walls of the furnishing hole 34.

The first locking part 110A is formed by cutting the center of the front surface of the press fitting part 86 and pulling the cut part so that the first locking part 110A projects obliquely downward.

Two of the second locking parts 110E are provided so as to project from each side of the press fitting part 86 (in total four of the second locking parts 110B are provided). An upper side of the second locking part 110E inclines and a lower side of the second locking part 110B is an edge.

The convex part 120 has a vertical cross-sectional configuration projecting in a half-circle shape and projects in an elliptically oblong direction. The convex part 120 comes in contact with the wide side internal wall of the furnishing hole 34. The projecting convex part 120 is wider than the first locking part 110A.

Therefore, even if the internal wall of the furnishing hole 34 is indented when the press fitting part 86 is press fit, the convex part 120 comes in contact with the wide side internal wall of the furnishing hole 34 as striding over the indented part and thereby the press fitting part 86 can be held in a non-rattling state.

Each of the board holding members 50 is furnished with the connector main body 30 in a body by locking (retaining) the first locking part 110A, the second locking parts 1103, and the convex part 120 of the press fitting part 86 with the internal walls of the furnishing hole 34.

The elastic arm part 90 is configured to function as a plate spring. A base end of the elastic arm part 90 is supported by the vertical part 82 of the fixing part 80. The elastic arm part 90 stands upward. In addition, the elastic arm part 90 includes a projection 92. The corresponding projections 92 come in contact with points in the vicinity of upper edges of left and right side surfaces of the connector main body 30. The projection 92 is configured to function as a positioning part which defines a standing position of the elastic arm part 90 relative to the side surface of the connector main body 30.

The elastic arm part 90 includes a bending part 94. The bending part 94 is formed by bending the elastic arm part 90 in a crank shape so that an engaging position of the engaging portion 70 corresponds to a position of an edge part of the expansion board 100. The bending part 94 is bent to cause a positional shift in the X direction between the engaging portion 70 and the vertical part 82.

(Furnishing State of the Board Holding Member 50)

Figure 4A:
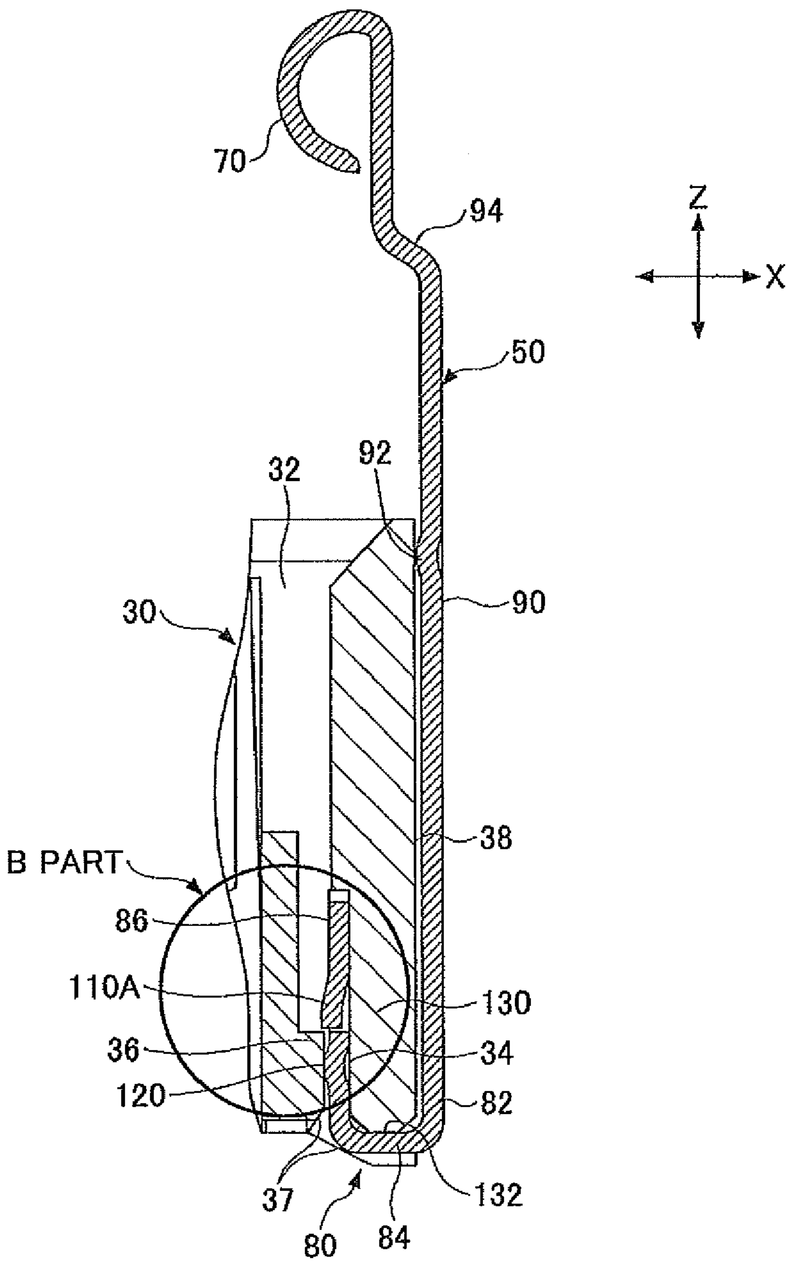
FIG. 4A is a vertical cross-sectional view showing a furnishing structure of the board holding member.
Figure 4B:
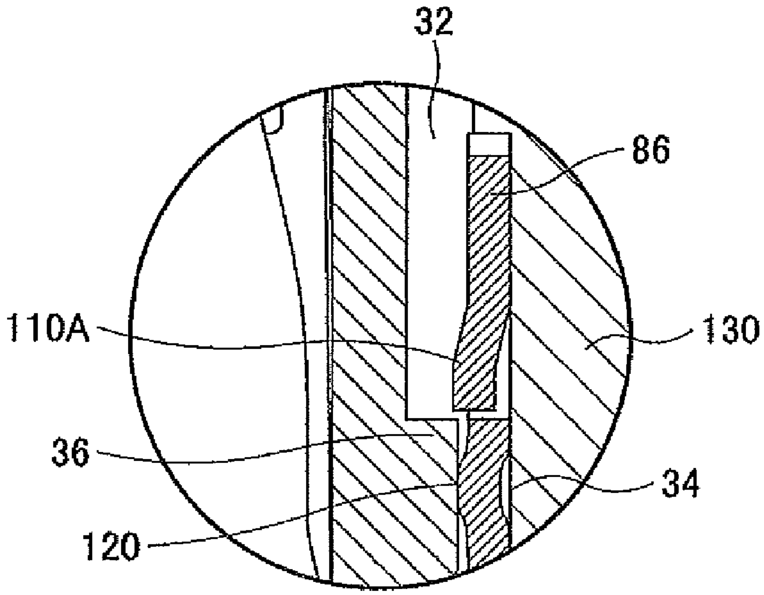
FIG. 4B is a vertical cross-sectional view showing a B portion shown in FIG. 4A.

Here, the furnishing state of the board holding member 50 is discussed. FIG. 4A is a vertical cross-sectional view showing a furnishing structure of the board holding member. FIG. 4B is a vertical cross-sectional view showing a B portion shown in FIG. 4A.

As shown in FIG. 4A and FIG. 43, the furnishing holes 34 are provided so as to pierce, in upper and lower directions (Z direction) in the vicinities of corresponding ends in the X direction, the connector main body 30. The press fitting part 86 of the board holding member 50 is inserted in the furnishing hole 34 from the bottom surface side. In addition, a step part 36 configured to prevent the press fitting part 86 from coming out is provided in the furnishing hole 34.

The furnishing hole 34 is formed so that a width dimension in the Y direction is substantially the same as a width dimension of the press fitting part 86 (excluding the second locking parts 110B) and a thickness dimension in the X direction is slightly greater than the thickness dimension of the press fitting part 86 (excluding the convex part 120).

In addition, a wall part 130 is formed between the side surface 38 of the connector main body 30 and the furnishing hole 34. The wall part 130 is configured to be engaged with the U shaped fixing part 80. A lower end of the wall part 130 includes a contact surface 132 where the horizontal part 84 of the fixing part 80 comes in contact.

When the board holding member 50 is furnished with the connector main body 30, the elastic arm part 90 of the board holding member 50 comes in contact with the side surface 38 of the connector main body 30 so that the furnishing position in the X direction is determined. In this state, the head of the press fitting part 86 is positioned in the bottom surface side opening of the furnishing hole 34. A bevel 37 is provided at the bottom surface side opening of the furnishing hole 34 so that the press fitting part 86 can be easily inserted in the furnishing hole 34.

Next, the board holding member 50 is pressed so as to be pushed up relative to the connector main body 30. As a result of this, the board holding member 50 press fits the press fitting part 86 into the furnishing hole 34 while the elastic arm part 90 is made to slide on the side surface 38 of the connector main body 30. At the time of press fitting, a cut and pulled up edge part of the first locking part 110A is elastically deformed inside so as to be slid on the internal wall of the furnishing hole 34.

When the horizontal part 84 of the fixing part 80 comes in contact with the contact surface 132 due to the press fitting operation, the cut and pulled up edge part of the first locking part 110A is deformed so as to pass through the furnishing hole 34 and face an upper surface of the step part 36.

As a result of this, when the board holding member 50 is pulled downward, the cut and pulled up edge part of the first locking part 110A comes in contact with the upper surface of the step part 36. Because of this, it is possible to prevent the board holding member 50 from being pulled out.

In addition, the edge parts of the second locking parts 110B projecting to both sides of the press fitting part 86 dig into the internal walls of the furnishing hole 34. Therefore, it is possible to prevent the board holding member 50 from being pulled out downward by the first locking part 110A and the second locking parts 110B.

In addition, where the press fitting part 86 is press fit in the furnishing hole 34, the convex part 120 of the press fitting part 86 comes in contact with the internal wall of the furnishing hole 34 so that the press fitting part 86 is held in the furnishing hole 34 without bouncing. Hence, the fixing part 80 of the board holding member 50 can be stably fixed to the connector main body 30.

Thus, in the board connecting connector 20, the furnishing holes 34, in each of which the press fitting part 86 of the board holding member 50 is press fit, and the wall parts 130 where the elastic arm parts 90 come in contact, are provided at both ends in a longitudinal direction.

Accordingly, the projecting length in the X direction is short so that miniaturization of the board connecting connector 20 and space savings can be achieved.

(Inserting Operation of the Expansion Board)

Here, an inserting operation of the expansion board 100 is discussed.

Figure 5A:
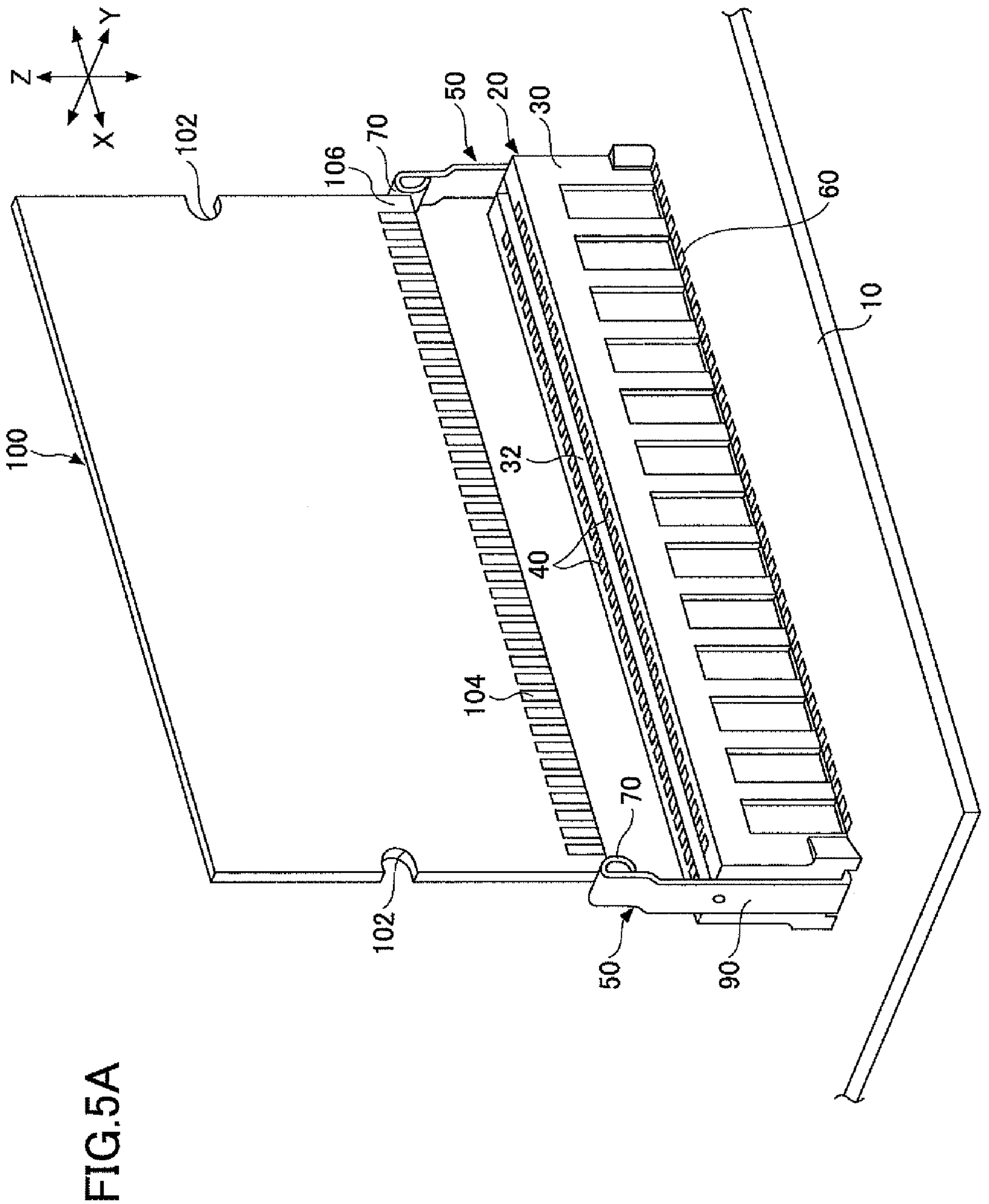
FIG. 5A is a perspective view of the board before being inserted in the connecting board connector.
Figure 5B:
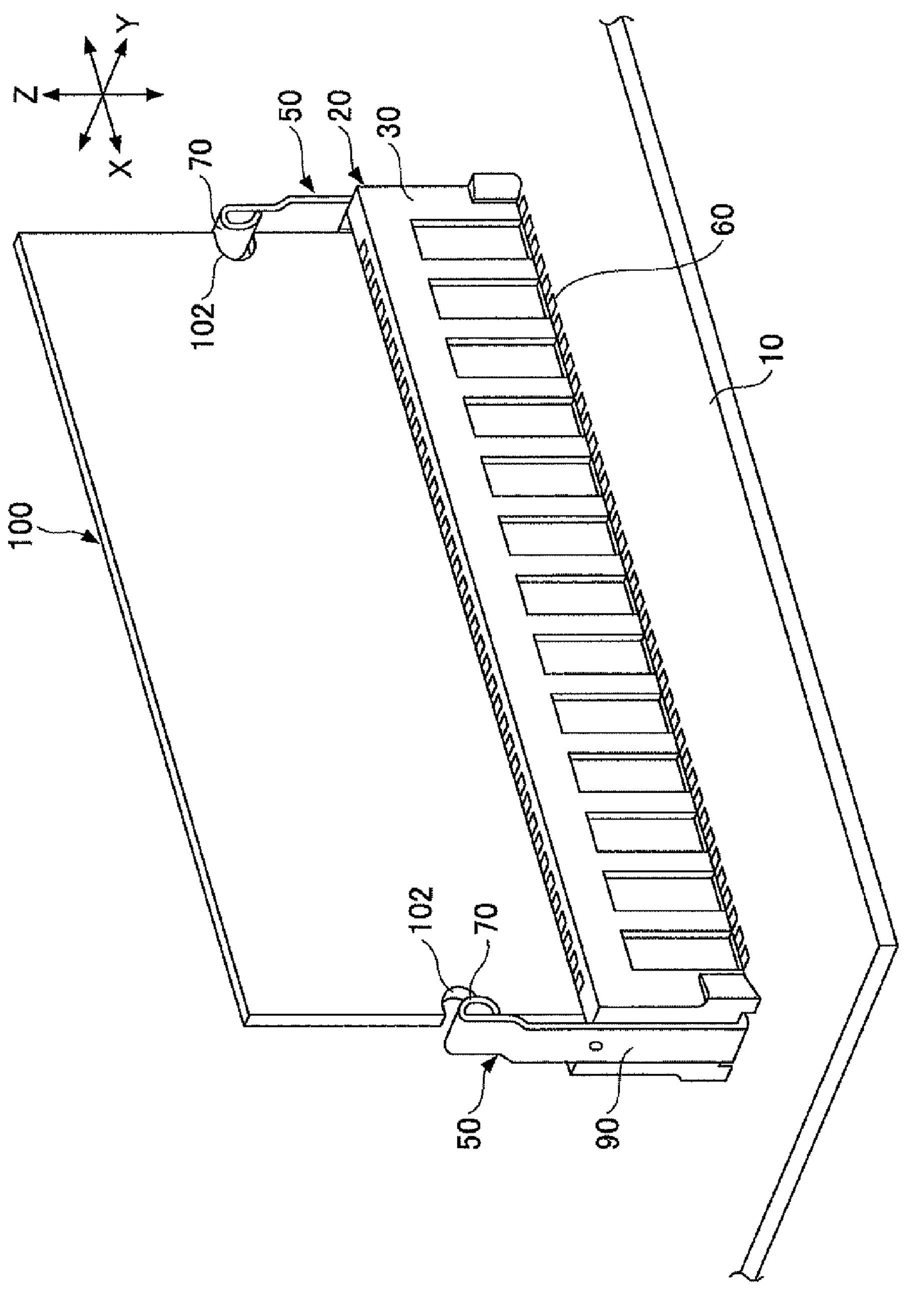
FIG. 5B is a perspective view showing a furnishing state where the board is inserted in the connecting board connector.
Figure 6A:
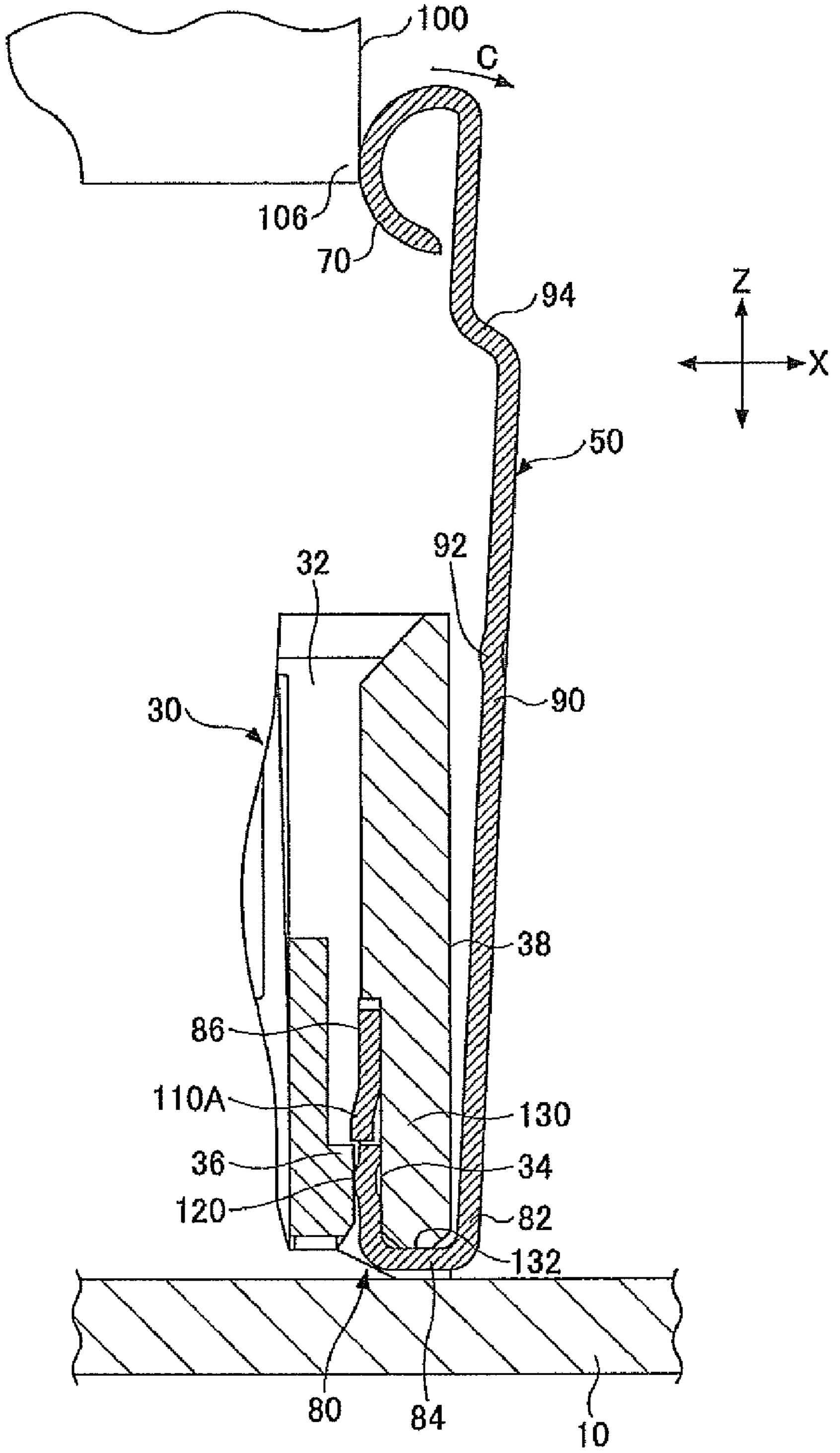
FIG. 6A is a vertical cross-sectional view showing a pressed state where the board holding member is pressed by an inserted board so as to be retracted.
Figure 6B:
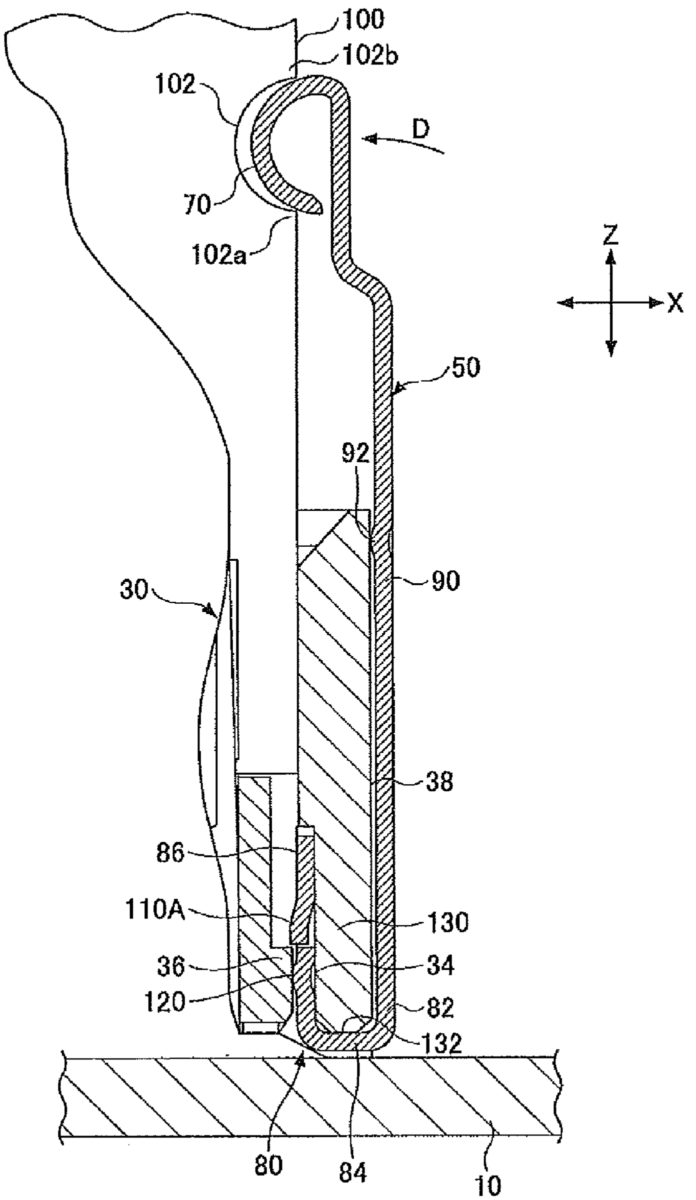
FIG. 6B is a vertical view showing a holding state where the board holding member holds the inserted board.

FIG. 5A is a perspective view showing the board 100 before being inserted in the connecting board connector 20. FIG. 5B is a perspective view showing a furnishing state where the board 100 is inserted in the connecting board connector 20. FIG. 6A is a vertical cross-sectional view showing a pressed state where the board holding member 20 is pressed by a to-be inserted board 100 so as to be retracted. FIG. 6B is a vertical view showing a holding state where the board holding member holds the inserted board 100.

As shown in FIG. 5A, the expansion board 100 is vertically inserted in an inserting opening of the board connecting connector 20 having lower ends mounted on the motherboard 10 where terminals 104 face downward. By the inserting operation of the expansion board 100, corner parts 106 at the lower end of the expansion board 100 come in contact with curved surfaces of the engaging portions 70 of the corresponding board holding members 50.

In addition, concave parts 102 for holding, formed in half-circle shapes, are provided at designated heights (in positions determined by a board inserting length in the vertical direction and the height of the engaging portions 70) one at each side in the X direction of the expansion board 100.

As shown in FIG. 6A, when the expansion board 100 is pressed downward during the inserting operation of the expansion board 100, the lower end corner parts 106 of the expansion board 100 come in contact with the curved surfaces of the corresponding engaging portions 70. When the expansion board 100 is pressed downward, the engaging portions 70 are pressed sideward (in the X direction), and the elastic arm parts 90 are elastically deformed outwardly (in the C direction).

Each of the elastic arm parts 90 is inclined in a C direction where the elastic arm part 90 is separated from the corresponding side surface 38 of the connector main body 30 when a lower end supported by the fixing part 80 is a fulcrum. Therefore, since the bending amount of the elastic arm part 90 is small, a pressing force (resistance force) applied to the expansion board 100 is small.

A curved surface of the engaging portion 70 of the board holding member 50, where the expansion board 100 comes in contact, is a metal surface and has a low coefficient of friction. Hence, the engaging portion 70 easily slides. Therefore, sliding resistance is low when the expansion board 100 is inserted. Because of this, while the expansion board 100 deforms the engaging portion 70 of the board holding member 50 with a relatively small operating force in the C direction, the expansion board 100 is inserted in the inserting opening 32 of the board connecting connector 20.

As shown in FIG. 5B and FIG. 6B, when the expansion board 100 is inserted in the inserting completion position, terminals 140 of the expansion board 100 come in contact with the corresponding connector pins 40 of the board connecting connector 20 so as to be electrically connected to the connector pins 40 of the board connecting connector 20.

In addition, the concave parts 102 provided at both sides in the X direction of the expansion board 100 go down to a position relatively facing the corresponding engaging portions 70 of the board holding member 50. Because of this, the engaging portions 70 of the board holding member 50 move in the D direction due to spring forces (returning force) of the elastic arm parts 90 so as to be engaged with the corresponding concave parts 102.

In this example, the radius of curvature of the engaging portion 70 is greater than the radius of curvature of the concave part 102. Accordingly, a part of a curved surface of the engaging portion 70 enters in the concave part 102 and the curved surface of the engaging portion 70 comes in contact with the corner parts 102*a* and 102*b* of the concave part 102. Thus, the expansion board 100 is held.

Accordingly, by performing a pressing operation whereby the expansion board 100 is inserted in the inserting opening 32 of the board connecting connector 20, the terminals 104 are sandwiched by the corresponding connector pins 40 and the engaging portions 70 of the board holding members 50 are engaged with the concave parts 102 of the expansion board 100.

Thus, the expansion board 100 is held in the inserting completion position. Because of this, even if vibration occurs when the connector 20 is carried, it is possible to prevent the expansion board 100 from being shifted from the inserting completion position of the board connecting connector 20.

Furthermore, in a case where the expansion board 100 is separated from the board connecting connector 20, when the expansion board 100 is lifted up, the corner parts 102*a* of the concave parts 102 press the curved surfaces of the engaging portions 70 of the board holding member 50 to the outside so that the engaging portions 70 are detached from the concave parts 102. Thus, the expansion board 100 is lifted upward and the elastic arm parts 90 are elastically deformed in the C direction (see FIG. 6A), so that the expansion board 100 is released.

Accordingly, when the expansion board 100 is pulled out from the board connecting connector 20, since the engaging portions 70 of the board holding members 50 are detached from the concave parts 102, it is possible to easily pull out the expansion board 100 regardless of the holding force of the board holding members 50.

MODIFIED EXAMPLES

Here, modified examples are discussed.

Figure 7:
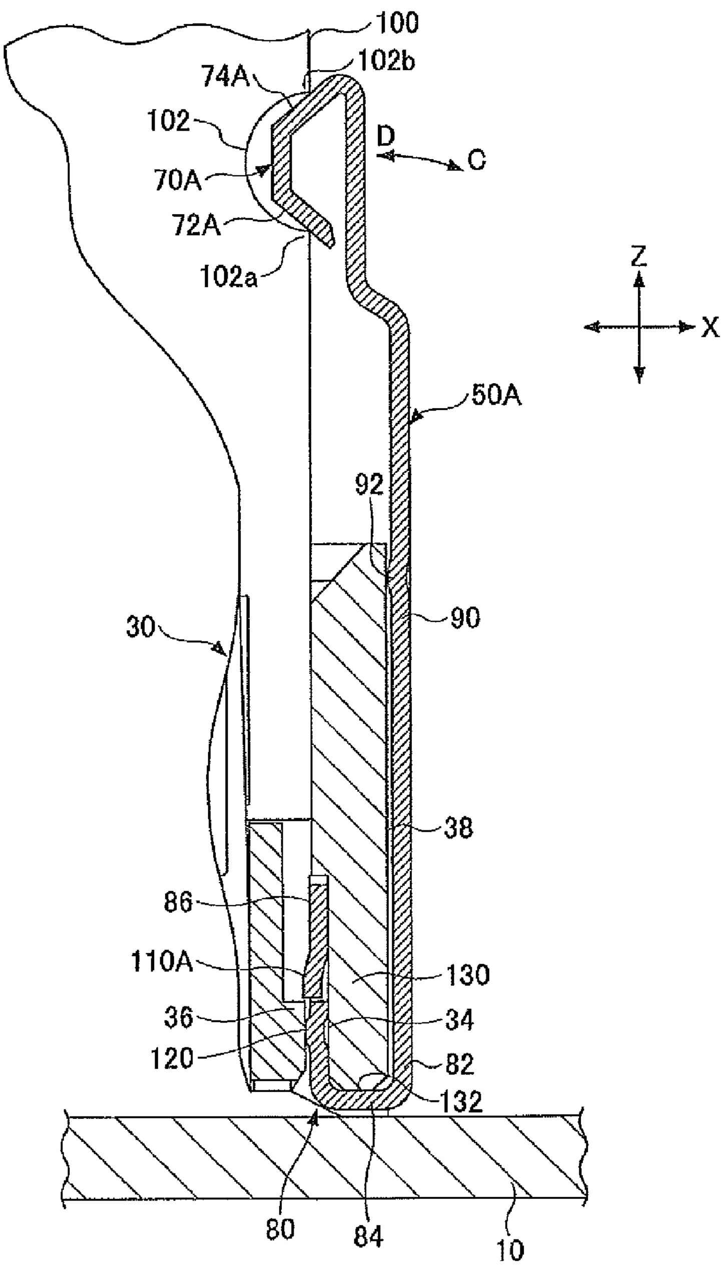
FIG. 7 is a vertical cross-sectional view showing a modified example 1 of the board holding member.

FIG. 7 is a vertical cross-sectional view showing a modified example 1 of the board holding member. In FIG. 7, parts that are the same as the parts shown in FIG. 6B are given the same reference numerals, and explanation thereof is omitted.

As shown in FIG. 7, an engaging portion 70A of a board holding member 50A of the modified example 1 is formed in a trapezoidal shape. The engaging portion 70A includes inclination parts 72A and 74A coming in contact with corner parts 102*a* and 102*b*, respectively, of the concave part 102.

The lower end corner part 106 of the expansion board 100 comes in contact with an upper side inclination part 74A of the engaging portion 70A with an inserting operation of the expansion board 100. In addition, the expansion board 100 is pressed downward so that the upper side inclination part 74A of the engaging portion 70A is pressed sideward (in the C direction) so that the elastic arm part 90 is elastically deformed outwardly (in the C direction). Because of this, the expansion board 100 is inserted in the inserting opening 32 of the board connecting connector 20 with a relatively small operation force.

Thus, by inserting the expansion board 100 in the inserting opening 32 of the board connecting connector 20, the terminals 104 are sandwiched by the corresponding connector pins 40 and the engaging portions 70A of the board holding members 50A are engaged with the corresponding concave parts 102 of the expansion board 100, so that the expansion board 100 can be held in the inserting completion position. Because of this, even if vibration occurs after the insertion is completed, the expansion board 100 can be prevented from being shifted from the inserting completion position of the board connecting connector 20.

In addition, in a case where the expansion board 100 is separated from the board connecting connector 20, by lifting the expansion board 100 upward, the corner parts 102*a* of the concave parts 102 press the lower side inclination parts 72A of the corresponding concave parts 70A outwardly (in the C direction), so that the engaging portions 70A can be detached from the concave parts 102.

Thus, the expansion board 100 is lifted upward so that the elastic arm parts 90 are elastically deformed outwardly so that the expansion board 100 is released. Hence, it is possible to easily separate the expansion board 100 from the board connecting connector 20.

Figure 8:
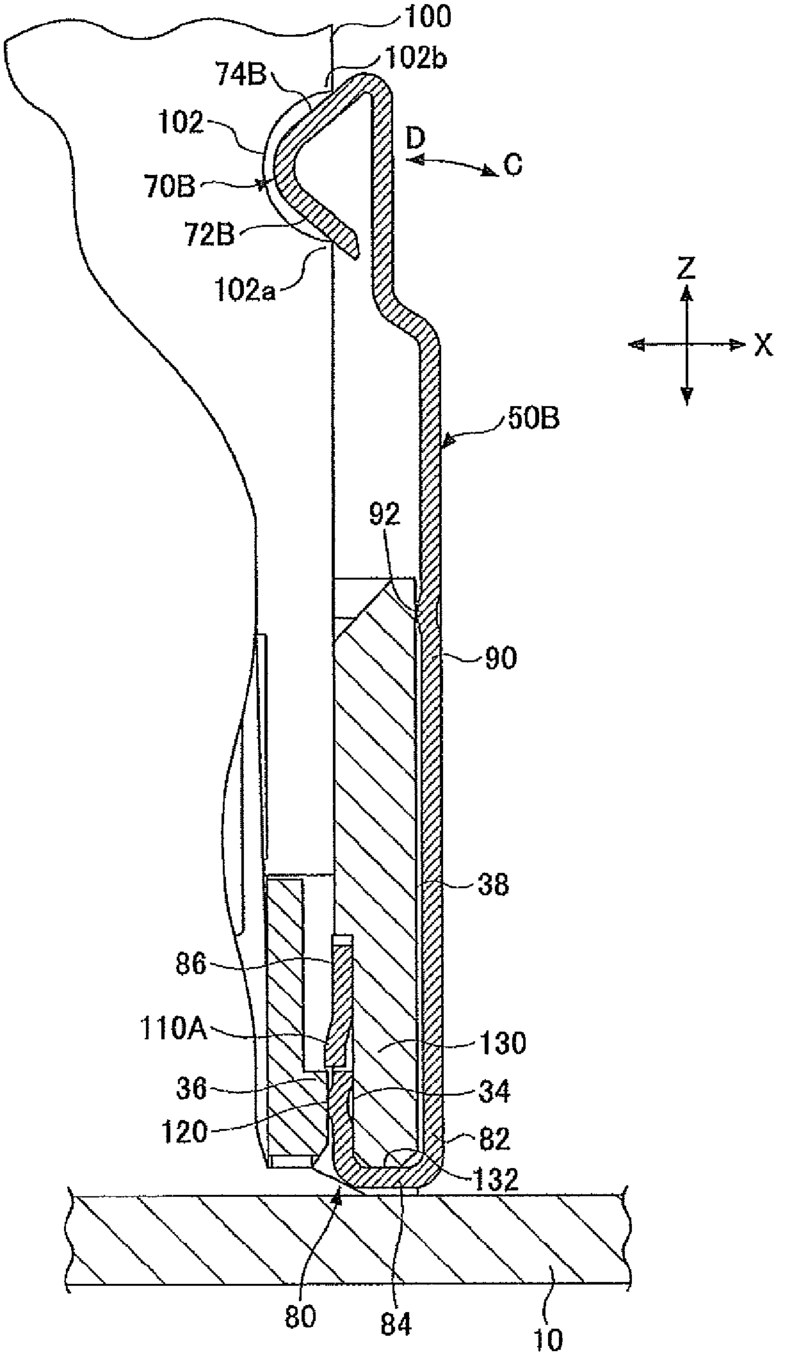
FIG. 8 is a vertical cross-sectional view showing a modified example 2 of the board holding member.

FIG. 8 is a vertical cross-sectional view showing a modified example 2 of the board holding member. In FIG. 8, parts that are the same as the parts shown in FIG. 6B are given the same reference numerals, and explanation thereof is omitted.

As shown in FIG. 8, an engaging portion 70B of a board holding member 50B of the modified example 2 is formed in a triangular shape. The engaging portion 70B includes inclination parts 72B and 74B coming in contact with corner parts 102*a* and 102*b*, respectively, of the concave parts 102. The inclination parts 72B and 74B incline at, for example, approximately 45 degrees relative to the vertical direction.

The lower end corner parts 106 of the expansion board 100 come in contact with the corresponding upper side inclination parts 74B of the engaging portions 70B with an inserting operation of the expansion board 100.

In addition, the expansion board 100 is pressed downward so that the upper side inclination parts 74B of the engaging portions 70B are pressed sideward (in the C direction) so that the elastic arm parts 90 are elastically deformed outwardly (in the C direction). Because of this, the expansion board 100 is inserted in the inserting opening 32 of the board connecting connector 20 with a relatively small operation force.

Thus, by inserting the expansion board 100 in the inserting opening 32 of the board connecting connector 20, the terminals 104 are sandwiched by the corresponding connector pins 40 and the engaging portions 70B of the board holding members 50B are engaged with the corresponding concave parts 102 of the expansion board 100, so that the expansion board 100 can be held in the inserting completion position. Because of this, even if vibration occurs after the insertion is completed, the expansion board 100 can be prevented from being shifted from the inserting completion position of the board connecting connector 20.

In addition, in a case where the expansion board 100 is separated from the board connecting connector 20, by lifting the expansion board 100 upward, the corner parts 102*a* of the concave parts 102 press the lower side inclination parts 72B of the concave parts 70B outwardly (in the C direction), so that the engaging portions 70B can be detached from the concave parts 102.

Thus, the expansion board 100 is lifted upward so that the elastic arm parts 90 are elastically deformed outwardly so that the expansion board 100 is released. Hence, it is possible to easily separate the expansion board 100 from the board connecting connector 20.

Figure 9:
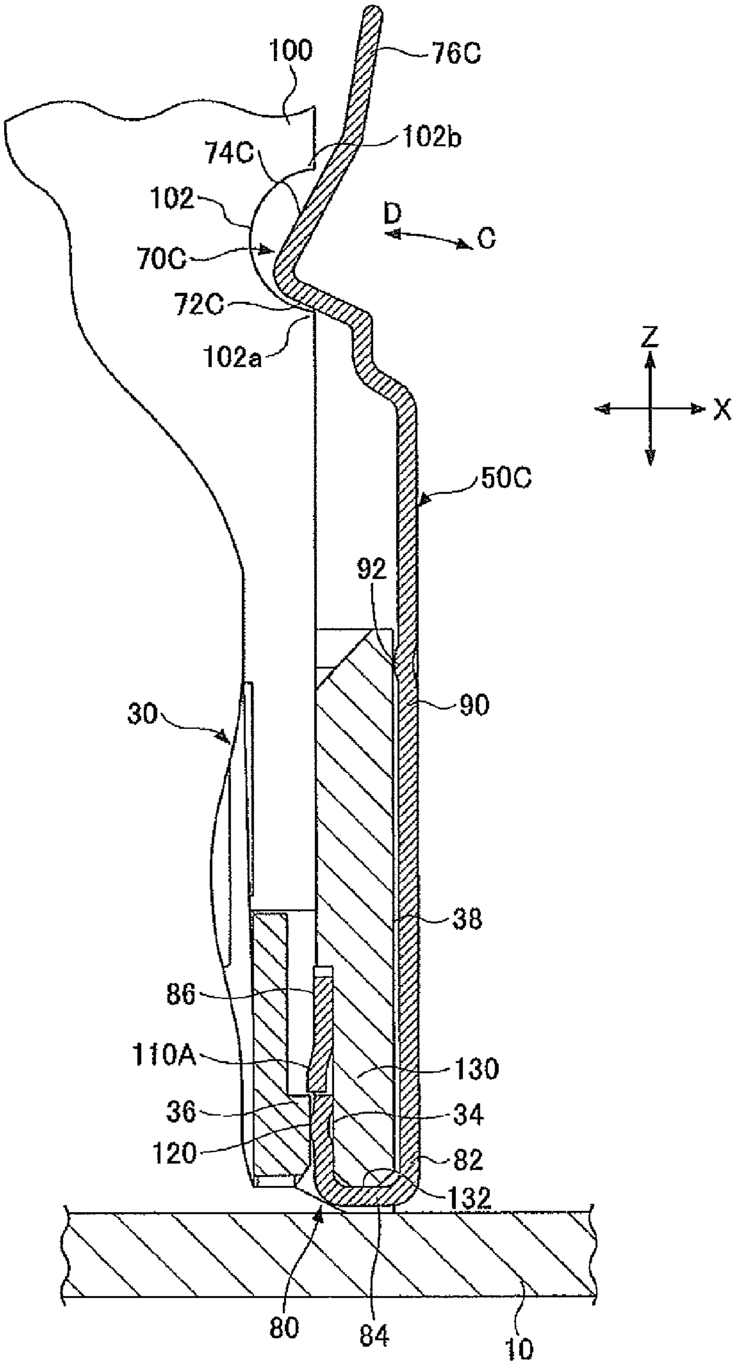
FIG. 9 is a vertical cross-sectional view showing a modified example 3 of the board holding member.

FIG. 9 is a vertical cross-sectional view showing a modified example 3 of the board holding member. In FIG. 9, parts that are the same as the parts shown in FIG. 6B are given the same reference numerals, and explanation thereof is omitted.

As shown in FIG. 9, the engaging portion 70C of the board holding member 50C of the modified example 3 includes inclination parts 72C and 74C coming in contact with corner parts 102*a* and 102*b*, respectively, of the concave part 102 and an extending part 76C extending upward. The inclination part 74C is inclined at, for example, approximately 30 degrees relative to the vertical direction. The inclination part 72C inclines at, for example, approximately 60 degrees relative to the vertical direction.

The lower end corner parts 106 of the expansion board 100 come in contact with the corresponding upper side inclination parts 74C of the engaging portions 70C with an inserting operation of the expansion board 100.

In addition, when the expansion board 100 is pressed downward, since the inclination angle of the upper side inclination part 74C is an acute angle relative to the vertical direction (inserting direction), it is possible to move the engaging portion 70C sideward (in the C direction) with a relatively small pressing force. Because of this, the expansion board 100 is inserted in the inserting opening 32 of the board connecting connector 20 with a relatively small operating force.

In addition, in a case where the expansion board 100 is separated from the board connecting connector 20, by pressing the extending parts 76C in the C direction, the lower side inclination parts 72C are made to go outwardly (in the C direction). Next, by lifting up the expansion board 100, the corner parts 102*a* of the concave parts 102 press the lower side inclination parts 72C of the concave parts 70C outwardly (in the C direction), so that the engaging portions 70C can be detached from the corresponding concave parts 102.

Thus, the expansion board 100 is lifted upward while the extending parts 76C are pressed in the C direction so that the expansion board 100 released. Hence, it is possible to separate the expansion board 100 from the board connecting connector 20 in this example easier than in the cases of the modified examples 1 and 2.

Figure 10:
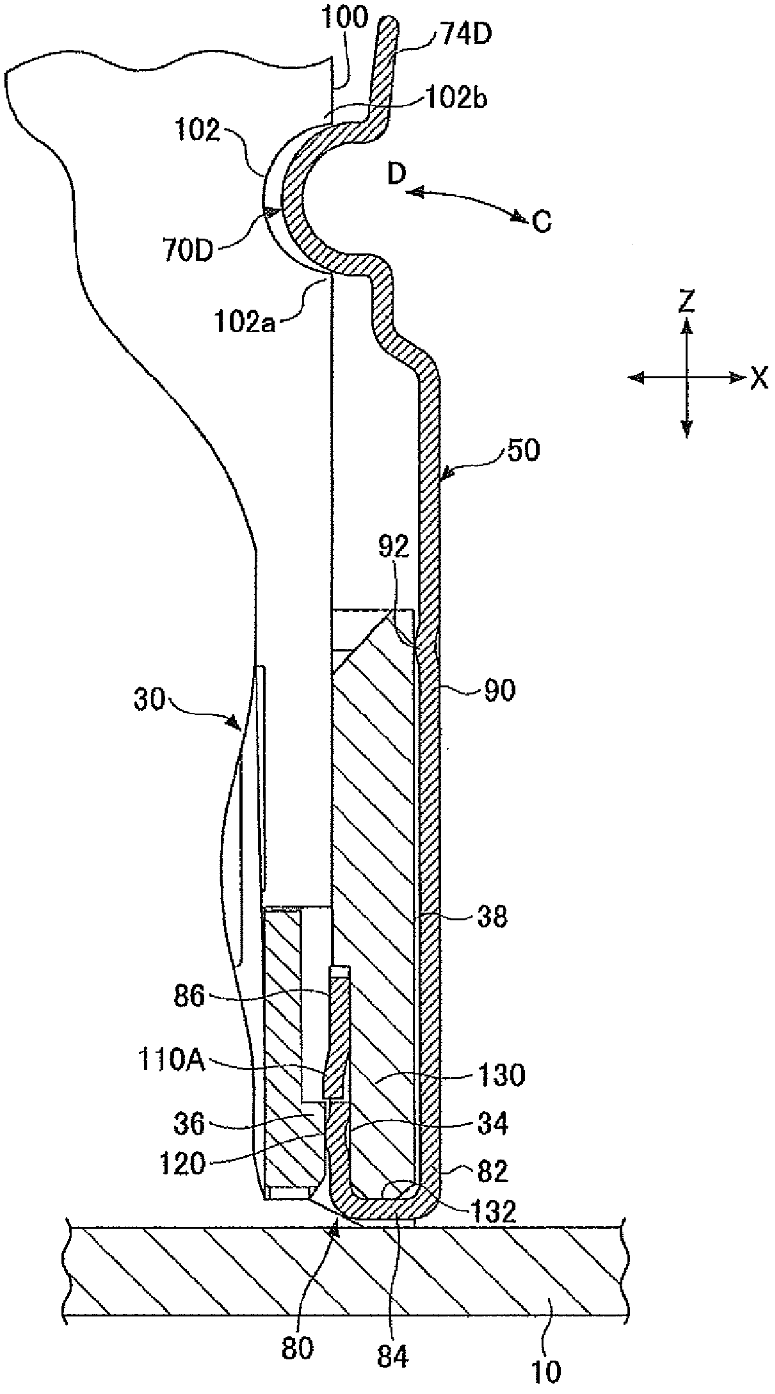
FIG. 10 is a vertical cross-sectional view showing a modified example 4 of the board holding member.

FIG. 10 is a vertical cross-sectional view showing a modified example 4 of the board holding member. In FIG. 10, parts that are the same as the parts shown in FIG. 6B are given the same reference numerals, and explanation thereof is omitted.

As shown in FIG. 10, an engaging portion 70D of a board holding member 50D of the modified example 4 is curved in a half-circle shape and includes an extending part 74D extending upward.

The lower end corner parts 106 of the expansion board 100 come in contact with curved surfaces of the corresponding engaging portions 70D with an inserting operation of the expansion board 100.

In addition, when the expansion board 100 is pressed downward, since the contact surfaces of the engaging portions 70D are curved, it is possible to move the engaging portions 70D sideward (in the C direction) with a relatively small pressing force. Because of this, the expansion board 100 is inserted in the inserting opening 32 of the board connecting connector 20 with a relatively small operating force.

In addition, in a case where the expansion board 100 is separated from the board connecting connector 20, by pressing the extending parts 74D in the C direction, the engaging portions 70D are made to go outwardly (in the C direction). Next, by lifting up the expansion board 100, the corner parts 102*a* of the concave parts 102 press the engaging portions 70D outwardly (in the C direction), so that the engaging portions 70D can be detached from the corresponding concave parts 102.

Thus, the expansion board 100 is lifted upward while the extending parts 74D are pressed in the C direction so that the expansion board 100 released. Hence, it is possible to separate the expansion board 100 from the board connecting connector 20 in this example easier than in the cases of the modified examples 1 and 2.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

The structure where the expansion board 100 is vertically inserted in the board connecting connector 20 is discussed in the above examples. However, the present invention is not limited to this structure. The present invention can be applied to a case where the expansion board 100 is inserted in a direction parallel with the upper surface of the mother board 10.

What is claimed is:

1. A board connecting connector configured to mount a mounting board on a motherboard, the board connecting connector comprising:

a connector main body having one end fixed to the motherboard and another end including an inserting opening where the mounting board is inserted;

a plurality of connector pins provided inside the inserting opening, the connector pins coming in contact with a plurality of terminals provided at an inserting side of the mounting board; and a board holding member elastically deformably standing at a side surface of the connector main body, wherein the board holding member is inserted in a position where the terminals of the mounting board come in contact with the connector pins and is engaged with an edge part of the mounting board, so that the mounting board is held in an inserting completion position;

wherein the board holding member is made of a metal spring member;

an engaging portion is provided at an end of the board holding member, the engaging portion being engaged with a concave part formed at a peripheral edge part of the mounting board; and a fixing part is provided at another end of the board holding member, the fixing part being fixed to the connector main body;

wherein the fixing part includes a press fitting part, the press fitting part being press fit in a furnishing hole, the furnishing hole opening to a side of the one end of the connector main body fixed to the motherboard;

wherein the press fitting part includes a lock part and a convex part, the lock part locking with an internal wall of the furnishing hole, the convex part coming in contact with the internal wall of the furnishing hole.

2. The board connecting connector as claimed in claim 1, wherein the board holding member includes an elastic arm part;

the elastic arm part is configured to bias the engaging portion in a direction where the engaging portion is engaged with the concave part and is configured to hold the engaging portion deformably in a direction where the engaging portion is detached from the concave part in a case where the mounting board is being inserted or detached; and a base end of the elastic arm is held at the fixing part.

3. The board connecting connector as claimed in claim 1, wherein the engaging portion is formed in one of an arc shape having a curved surface and an inclined shape which is inclined relative to an inserting direction.

4. The board connecting connector as claimed in claim 2, wherein the elastic arm part includes a projection, the projection projecting so as to come in contact with a side surface of the connector main body.

5. The board connecting connector as claimed in claim 1, wherein the lock part includes a first locking part and a second locking part;

the first locking part is configured to lock with a wide side internal wall of the furnishing hole; and the second locking part is configured to lock with a narrow side internal wall of the furnishing hole.

6. The board connecting connector as claimed in claim 5, wherein the first locking part is formed by cutting the press fitting part and pulling; and the connector main body includes a step part formed in the furnishing hole, the step part coming in contact with an end part of the first lock part so that the board holding member is prevented from being pulled out.

* * * * *